United States Patent
Danjo

(10) Patent No.: US 9,093,965 B2
(45) Date of Patent: Jul. 28, 2015

(54) FOLDED CASCODE AMPLIFIER CIRCUIT

(71) Applicant: FUJITSU LIMITED, Kawasaki-shi, Kanagawa (JP)

(72) Inventor: Takumi Danjo, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 46 days.

(21) Appl. No.: 14/178,529

(22) Filed: Feb. 12, 2014

(65) Prior Publication Data

US 2014/0292410 A1 Oct. 2, 2014

(30) Foreign Application Priority Data

Mar. 28, 2013 (JP) .................. 2013-069947

(51) Int. Cl.
*H03F 3/45* (2006.01)

(52) U.S. Cl.
CPC ........ *H03F 3/45183* (2013.01); *H03F 3/45192* (2013.01); *H03F 2203/45512* (2013.01); *H03F 2203/45562* (2013.01); *H03F 2203/45631* (2013.01); *H03F 2203/45644* (2013.01)

(58) Field of Classification Search
CPC ....................................... H03F 3/45
USPC .................................................. 330/253, 260
See application file for complete search history.

(56) References Cited

U.S. PATENT DOCUMENTS 7,592,867 B2 * 9/2009 Trifonov et al. ............... 330/253

FOREIGN PATENT DOCUMENTS

JP 2011024086 2/2011

* cited by examiner

*Primary Examiner* — Khanh V Nguyen
*Assistant Examiner* — Khiem Nguyen
(74) *Attorney, Agent, or Firm* — Fujitsu Patent Center

(57) ABSTRACT

A folded cascode amplifier circuit includes: an input stage having a pair of transistors and configured to output a positive phase intermediate signal and an opposite phase intermediate signal; a cascode amplification stage having pairs of transistors connected in multiple stages, to which the positive phase intermediate signal and the opposite phase intermediate signal are supplied, and which is configured to output a positive phase output signal and an opposite phase output signal, which are differential signals; a first capacitor connected between a signal line of the positive phase intermediate signal and a signal line of the opposite phase output signal; and a second capacitor connected between a signal line of the opposite phase intermediate signal and a signal line of the positive phase output signal.

6 Claims, 16 Drawing Sheets

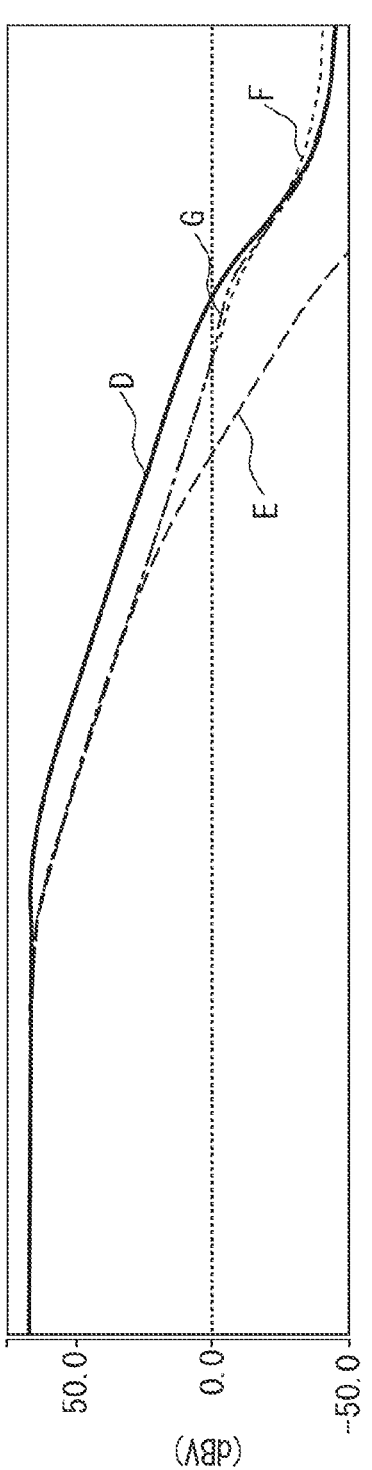
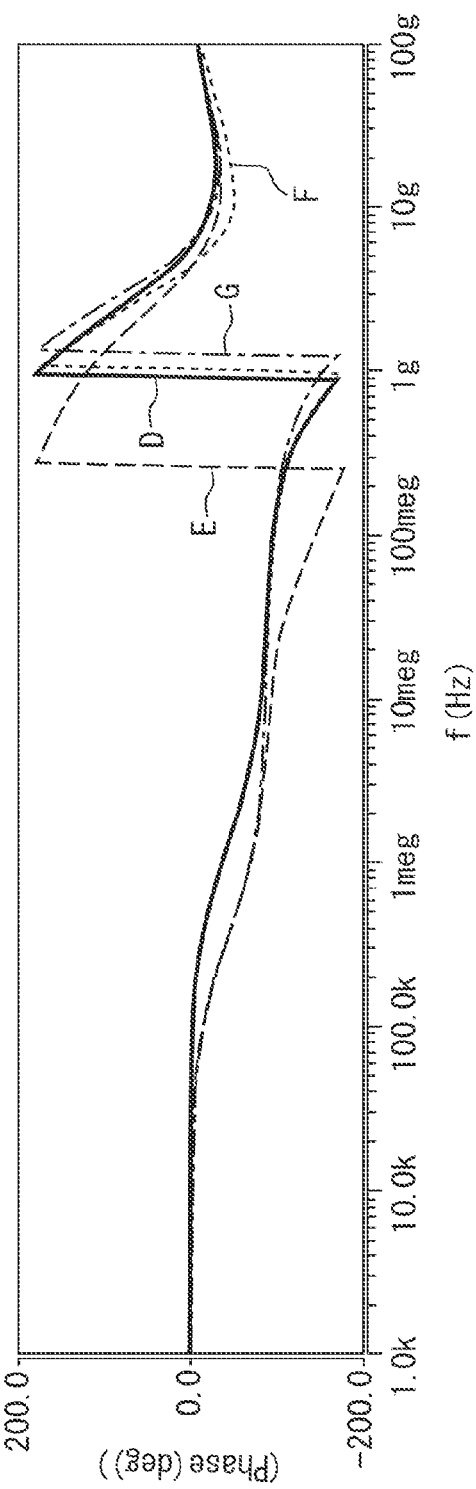
FIG. 16A
FIG. 16B

FOLDED CASCODE AMPLIFIER CIRCUIT

CROSS-REFERENCE TO RELATED APPLICATION

This application is based upon and claims the benefit of priority of the prior Japanese Patent Application No. 2013-069947, filed on Mar. 28, 2013, the entire contents of which are incorporated herein by reference.

FIELD

The technique disclosed herein relates to a folded cascode amplifier circuit.

BACKGROUND

A folded cascode amplifier circuit is widely used as a one-stage amplifier with high gain and high speed, and is a one-stage amplifier. However, has a pole of frequency-gain/phase characteristics in the vicinity of folded nodes X and Y and an output node and has a high gain. Because of this, if it is used with negative feedback being set and the load of feedback is small, the phase margin runs short and there is a possibility that oscillation occurs.

Consequently, measures to prevent oscillation have been proposed, however, there have been such problems that a capacitor with a large area in LSI, that power increases, is provided, etc.

RELATED DOCUMENTS

[Patent Document 1] Japanese Laid Open Patent Document No. 2011-024086

SUMMARY

A folded cascode amplifier circuit includes:
an input stage having a pair of transistors and configured to output a positive phase intermediate signal and an opposite phase intermediate signal, which are differential signals; a cascode amplification stage having pairs of transistors connected in multiple stages, to which the positive phase intermediate signal and the opposite phase intermediate signal are supplied, and which is configured to output a positive phase output signal and an opposite phase output signal, which are differential signals; a first capacitor connected between a signal line of the positive phase intermediate signal and a signal line of the opposite phase output signal; and a second capacitor connected between a signal line of the opposite phase intermediate signal and a signal line of the positive phase output signal.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIG. 16A and FIG. 16B are diagrams illustrating the frequency-gain characteristics and the frequency-phase characteristics of the folded cascode amplifier circuit of another embodiment obtained from the result of AC analysis performed to check the effect.

DESCRIPTION OF EMBODIMENTS

Before explaining the folded cascode amplifier circuit of the embodiment, a general folded cascode amplifier circuit will be explained.

Figure 1:
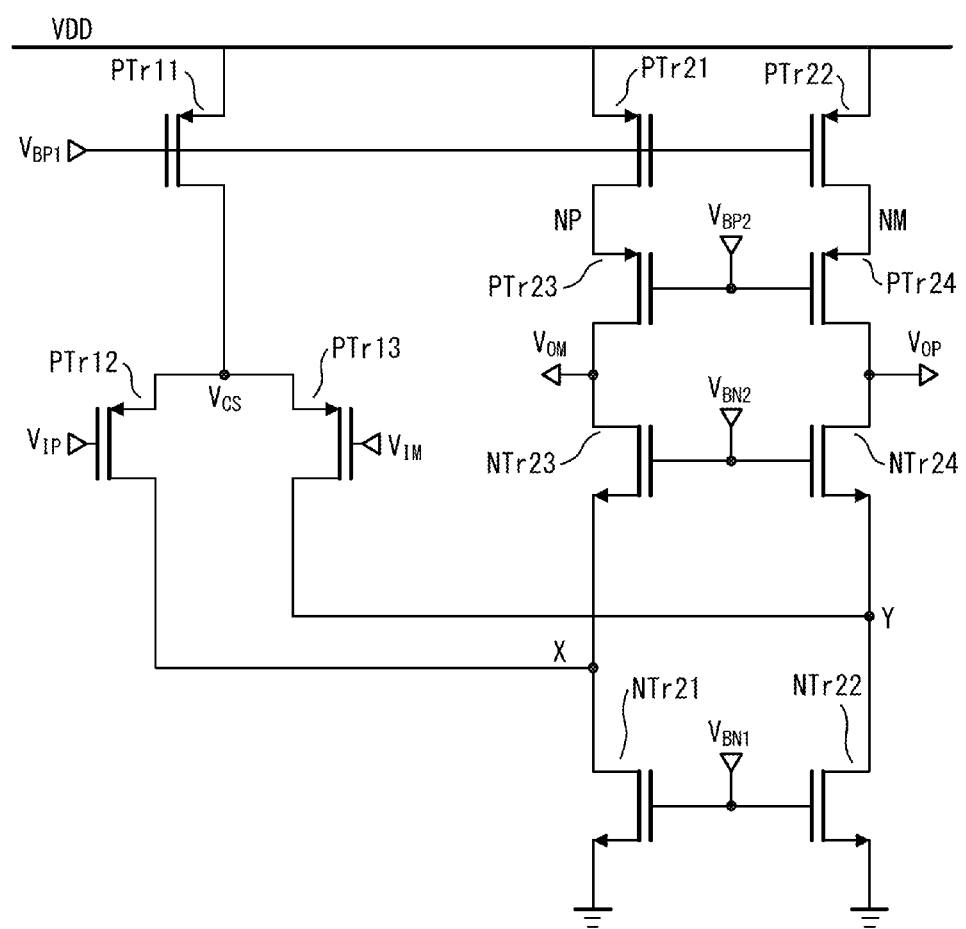
FIG. 1 is a circuit diagram of a general differential type folded cascode amplifier circuit.

FIG. 1 is a circuit diagram of a general differential type folded cascode amplifier circuit.

This amplifier circuit has an input stage and a cascode amplification stage. The input stage has three PMOS transistors PTr11, PTr12, and PTr13. To the gate of PTr11, a bias signal $V_{BP1}$ is supplied and PTr11 functions as a load. PTr12 and PTr13 form a differential pair and output positive phase and opposite phase intermediate signals in accordance with input signals $V_{IP}$ and $V_{IM}$ supplied to the gates of PTr12 and PTr13. The signal generated at the drain of PTr12 is an opposite phase signal of the positive phase input signal $V_{IP}$ supplied to the gate of PTr12, and the signal generated at the drain of PTr13 is an opposite phase signal of the opposite phase input signal $V_{IM}$ supplied to the gate of PTr13, that is, an positive phase signal. Consequently, the signal generated at the drain of PTr12 is referred to as an opposite phase intermediate signal and the signal generated at the drain of PTr13 as a positive phase intermediate signal.

The cascode amplification stage has four PMOS transistors PTr21, PTr22, PTr23, and PTr24, and four NMOS transistors NTr21, NTr22, NTr23, and NTr24. PTr21 and PTr22, PTr23 and PTr24, NTr21 and NTr22, and NTr23 and NTr24 each form a differential pair. PTr21, PTr23, NTr21, and NTr23 are connected between a power source VDD and GND. $V_{BP1}$ is supplied to the gates of PTr21 and PTr22, and $V_{BP2}$ is supplied to the gates of PTr23 and PTr24. $V_{BN1}$ is supplied to the gates of NTr21 and NTr22, and $V_{BN2}$ is supplied to the gates of NTr23 and NTr24. The opposite phase intermediate signal is supplied to a connection node X of NTr21 and NTr23 and the positive phase intermediate signal is connected to a connection node Y of NTr22 and NTr24.

The folded cascode amplifier circuit in FIG. 1 amplifies differential input signals $V_{IP}$ and $V_{IM}$ and outputs differential output signals $V_{OP}$ and $V_{OM}$. The input signal $V_{IP}$ is referred to as a positive phase input signal, $V_{IM}$ as an opposite phase input signal, the output signal $V_{OP}$ as a positive phase output signal, and $V_{OM}$ as an opposite phase output signal. Further, the node at which the differential output signals $V_{OP}$ and $V_{OM}$ are output is referred to as the output node.

The folded cascode amplifier circuit in FIG. 1 is widely known, and therefore, more explanation is omitted.

Figure 2:
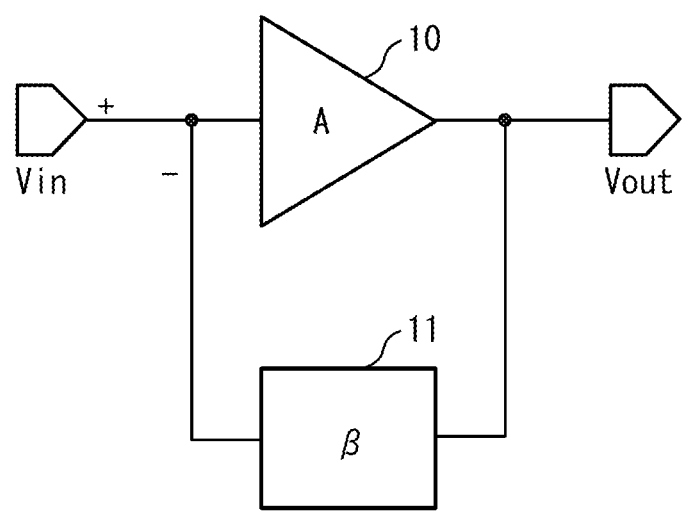
FIG. 2 is a diagram illustrating a general circuit configuration when an amplifier circuit is used.

FIG. 2 is a diagram illustrating a general circuit configuration when an amplifier circuit is used.

As illustrated in FIG. 2, negative feedback is set by connecting a feedback element (β) 11 between an output and an input of an amplifier circuit (amplifier: A) 10. It is known that when negative feedback is set, if there is a gain equal to or more than 0 dB at a frequency at which the phase rotates through 180 degrees, the oscillation condition is met and oscillation occurs. Because of this, the amplifier circuit is prevented from having a gain equal to or more than 0 dB at a frequency at which the phase rotates through 180 degrees to prevent oscillation.

The folded cascode amplifier circuit in FIG. 1 is frequently used as a one-stage amplifier with high gain and high speed. The folded cascode amplifier circuit in FIG. 1 is a one-stage amplifier, however, has the pole of the frequency-gain/phase characteristics in the vicinity of the folded nodes X and Y and the output node, and has a high gain.

Because of this, if the folded cascode amplifier circuit in FIG. 1 is used with negative feedback being set as in FIG. 2 and the load of feedback is small, the phase margin runs short and there is a possibility that oscillation occurs.

Figure 3:
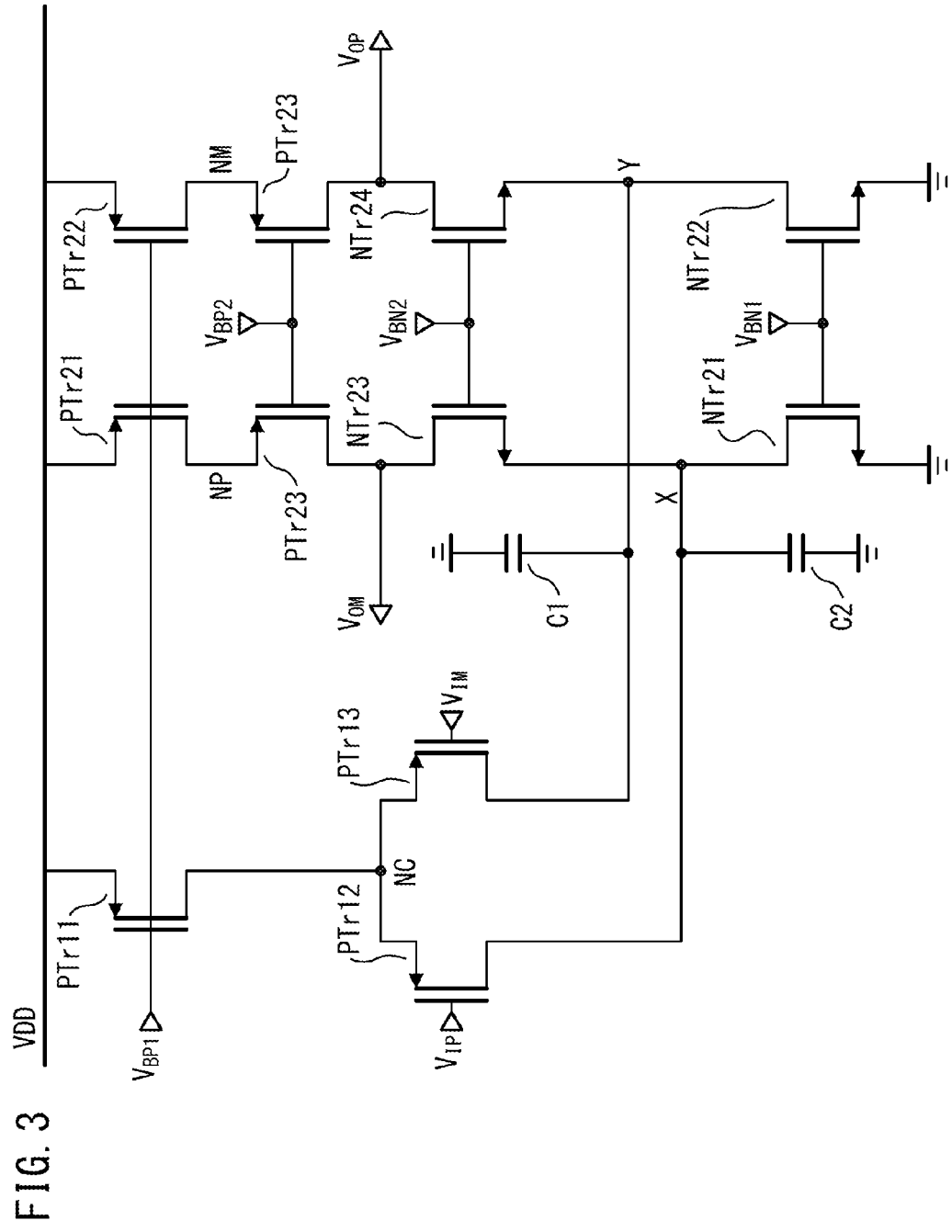
FIG. 3 is circuit diagram when measures against oscillation are taken in the case where the folded cascode amplifier circuit in FIG. 1 is used with negative feedback being set.

FIG. 3 is circuit diagram when measures against oscillation are taken in the case where the folded cascode amplifier circuit in FIG. 1 is used with negative feedback being set.

In the circuit in FIG. 3, measures against oscillation are taken by connecting capacitors C2 and C1 between the folded node X and GND and between the folded node Y and GND, respectively, to compensate for phases. It may also be possible to connect capacitors between VDD and the folded nodes.

Figure 4:
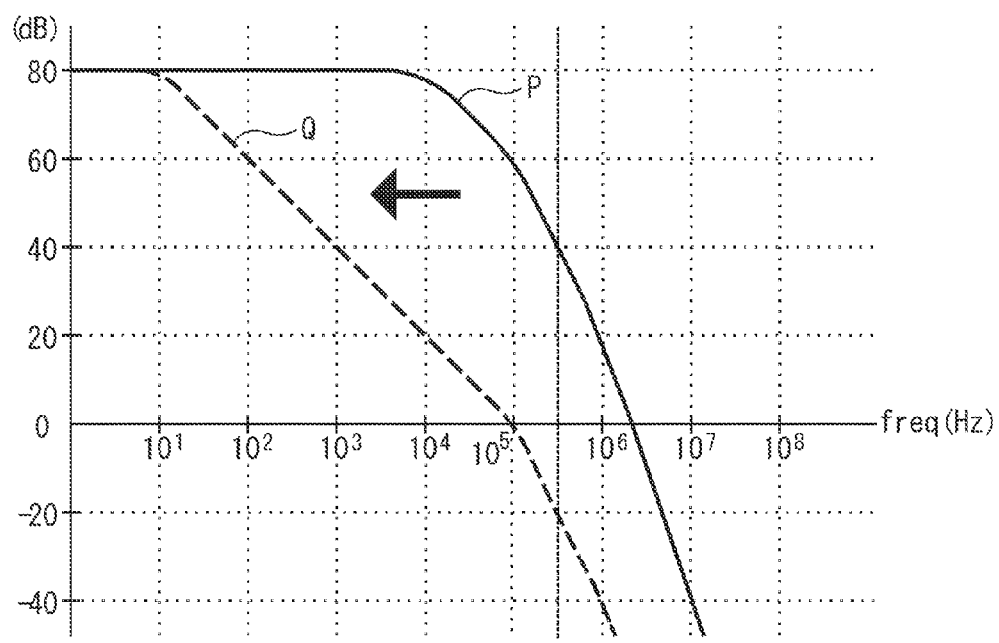
FIG. 4 is a diagram illustrating the frequency-gain characteristics of the folded cascode amplifier circuit in FIG. 1 and in the case where measures against oscillation are taken in FIG. 2.

FIG. 4 is a diagram illustrating the frequency-gain characteristics of the folded cascode amplifier circuit in FIG. 1 and in the case where measures against oscillation are taken in FIG. 2. In FIG. 4, P represents the frequency-gain characteristics of the folded cascode amplifier circuit in FIG. 1 and Q represents the frequency-gain characteristics in the case where measures against oscillation are taken in FIG. 2.

For example, in the case where the folded cascode amplifier circuit in FIG. 1 is used with negative feedback being set as in FIG. 2, if there is a gain equal to or more than 0 dB at a frequency at which the phase rotates through 180°, oscillation occurs. Because of this, as in FIG. 3, by giving a large capacitor to the X and Y nodes, which are each the first pole, the position of the pole is shifted toward the side of lower frequencies to give the characteristics as represented by Q, and thus, the circuit is prevented from having a gain equal to or more than 0 dB at a frequency at which the phase rotates through 180°.

However, in order to shift the characteristics represented by P to the characteristics represented by Q, a large capacitor is provided.

The folded cascode amplifier circuit is frequently provided as each individual IC and mounted on a circuit substrate etc., and therefore, capacitor elements having a large value are mounted on the circuit substrate and used as the capacitors C1 and C2 in FIG. 3. In recent years, the folded cascode amplifier circuit is mounted on LSI together with other circuits. Further, miniaturization of the semiconductor devices has improved and the number of functions thereof has increased, and the folded cascode amplifier circuit has become part of the circuit within LSI. In order to form a capacitor within LSI, a large area is used. Because of this, if a large capacitor as in FIG. 3 is added to the folded cascode amplifier circuit mounted on LSI, there arises such a problem that the area increases.

In order to solve the problem as described above, it is proposed to implement phase compensation by connecting a buffer (source follower) and a comparatively small capacitor between the output node and the folded node to advance the phase. However, this proposal requires a buffer (source follower), and therefore, power and the area increase.

As described above, the folded cascode amplifier circuit is requested to perform phase compensation, however, it is undesirable to obtain a capacitor that uses a large area only for phase compensation. Further, it is also undesirable to add another circuit as described above because the circuit becomes complicated and power increases.

Consequently, the use of the Miller effect by which the same effect as that when substantially large capacitors are added is obtained even if the number of capacitors to be added is reduced is discussed.

Figure 5B:
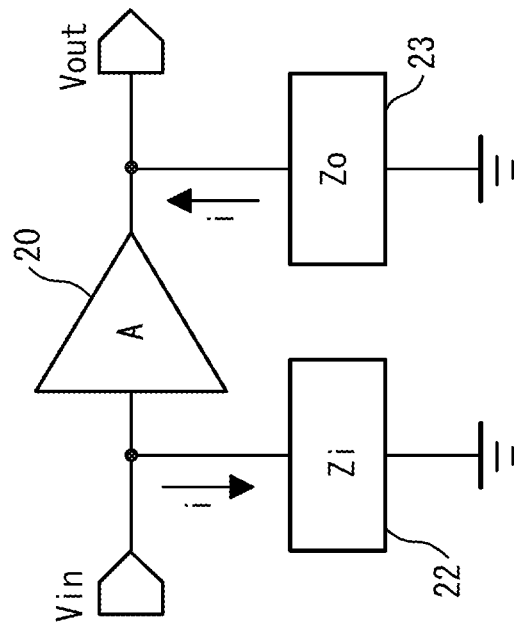
FIG. 5A and FIG. 5B are diagrams explaining the Miller effect.
Figure 5A:
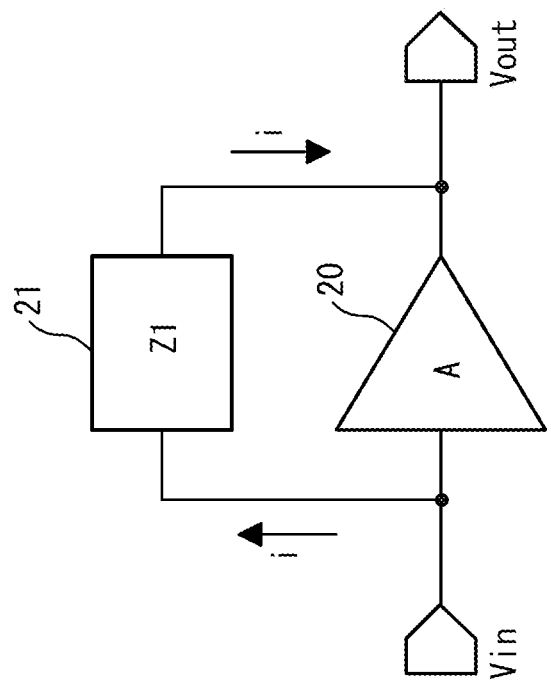

FIG. 5A and FIG. 5B are diagrams explaining the Miller effect.

As illustrated in FIG. 5A, a circuit is considered, in which an amplifier 20 with gain A and an impedance element 21 having impedance Z1 are connected in parallel. As illustrated in FIG. 5B, this circuit is equivalent to a circuit in which an impedance element 22 with input impedance Zi is connected between the input of the amplifier 20 and GND and an impedance element 23 with output impedance Zo is connected between the output of the amplifier 20 and GND. If it is assumed that the input impedance of the amplifier 20 is sufficiently high, Vout=AVin holds.

As in FIG. 5A, if the current flowing through the impedance element 21 is taken to be i, $$i=(Vin-Vout)/Z1=(Vin-AVin)/Z1.$$

Consequently, the input impedance Zi of this circuit is expressed by $$Zi=Vin/i=Z1/(1-A).$$

The output impedance Zo of the circuit is expressed by $$Zo=(-Vout)/i=(-AVin)/i=(-AZ1)/(1-A)=Z1/(1-1/A).$$

Figure 6B:
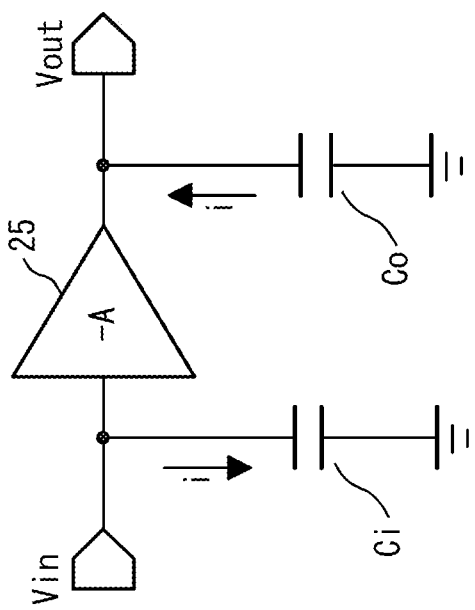
FIG. 6A and FIG. 6B are diagrams explaining the Miller effect and showing the case where the impedance elements in FIG. 5A and FIG. 5B are replaced with capacitors.
Figure 6A:
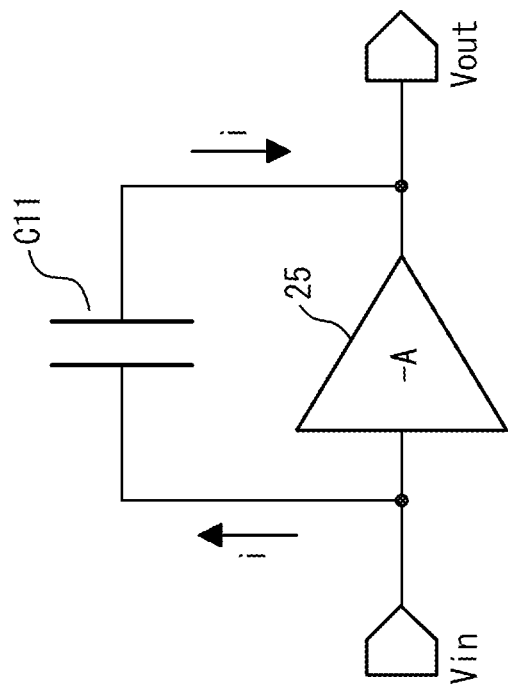

FIG. 6A and FIG. 6B are diagrams explaining the Miller effect and showing the case where the impedance elements in FIG. 5A and FIG. 5B are replaced with capacitors.

A case is considered, where the impedance element 21 with impedance Z1 is replaced with the capacitor C1 and the amplifier 20 with gain A is replaced with an amplifier 25 with gain (−A), as illustrated in FIG. 6A. In this case, as illustrated in FIG. 6B, a capacitance Ci that appears from the input side is expressed by an expression below Z1=1/(sC1), and therefore, Zi=Z1/(1−A)=1/(sC1(1+A)), consequently, the capacitance Ci that appears from the input side will be (1+A) times that of C1. This is the Miller effect.

Figure 7:
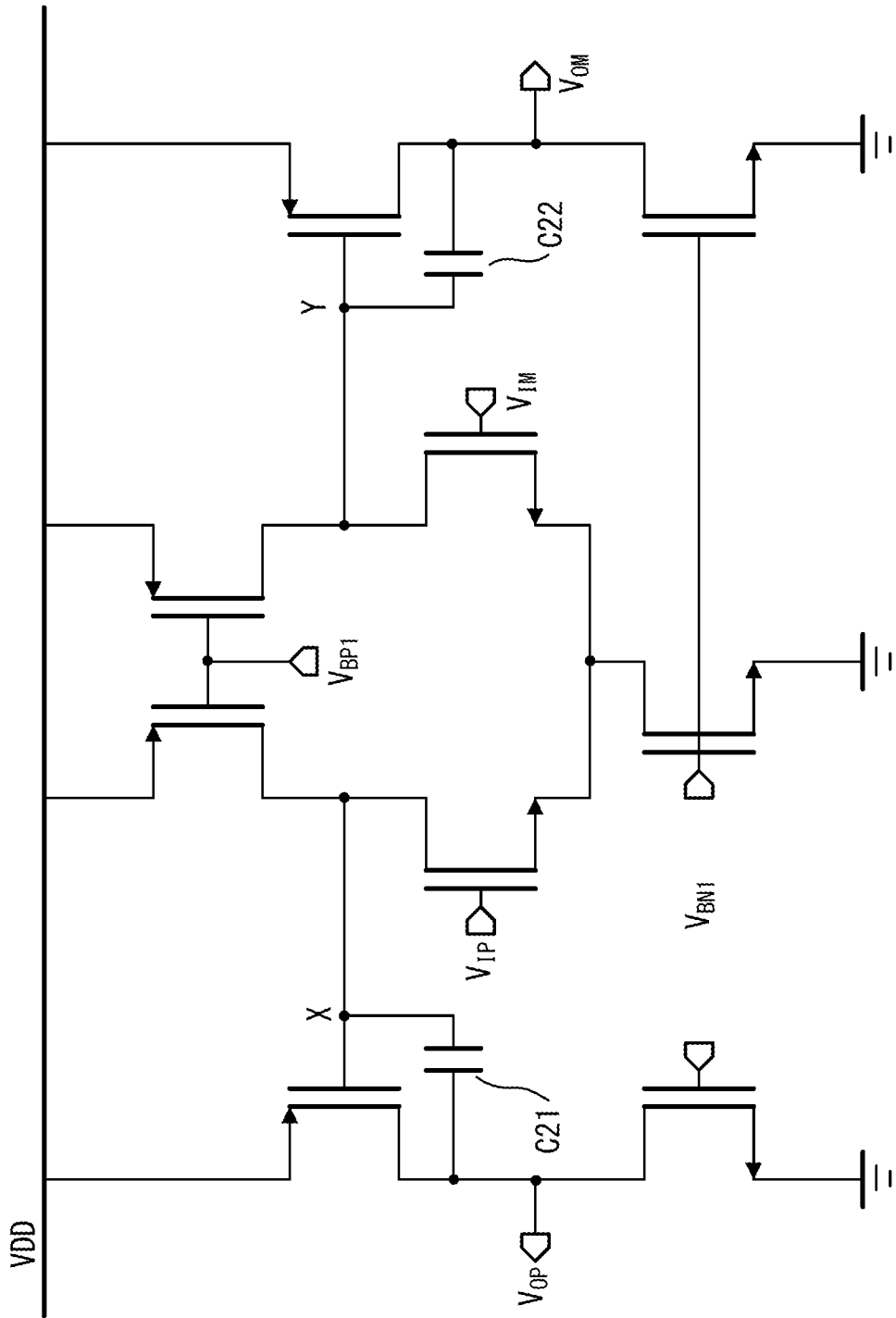
FIG. 7 is a diagram illustrating an example of a two-stage amplifier circuit that utilizes the Miller effect.

FIG. 7 is a diagram illustrating an example of a two-stage amplifier circuit that utilizes the Miller effect.

In the circuit in FIG. 7, phase compensation is performed by connecting capacitors C21 and C22 between the input and the output in the second stage. In this case, transistors PMOS to the gates of which the nodes X and Y are connected are the second amplification stages. Because the amplifier in the second stage in FIG. 7 is a source-grounded amplifier and has the gain −A (A>0), the connection is the same as that in FIG. 6A, and therefore, the capacitance from the nodes X and Y to the output nodes appears (1+A) times magnified from the nodes X and Y.

If the configuration described above is applied to the folded cascode amplifier circuit, it is thought that phase compensation can be performed effectively.

Figure 8:
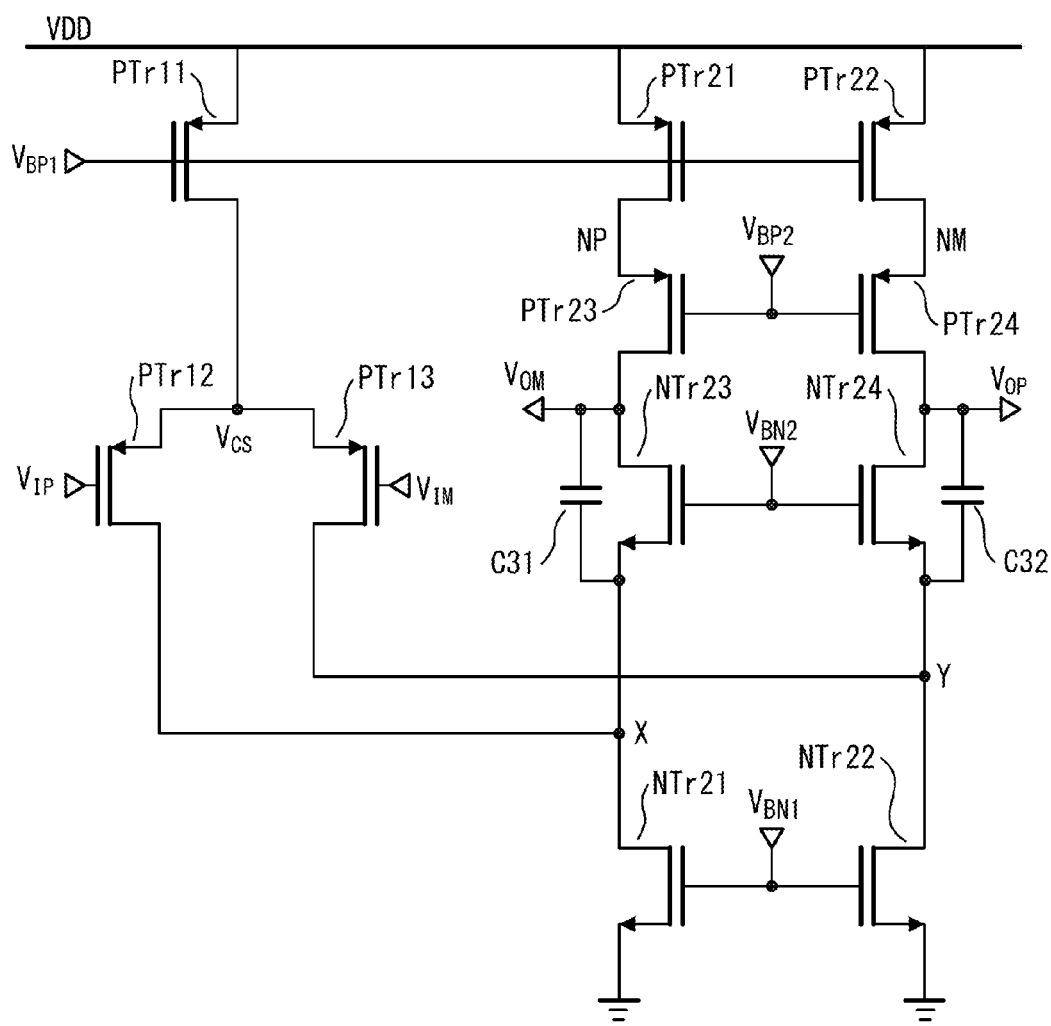
FIG. 8 is a diagram illustrating a circuit in which capacitors are connected between the source and the drain of the amplification transistors.

FIG. 8 is a diagram illustrating a circuit in which a capacitor C31 is connected between the source and the drain of the amplification transistor NTr23 and a capacitor C32 is connected between the source and the drain of NTr24 in the amplification stage.

However, in the circuit in FIG. 8, NTr21 and NTr22 are gate-grounded transistors, and therefore, gain A>0 and the Miller effect is not obtained.

Consequently, how to obtain the Miller effect in the folded cascode amplifier circuit in FIG. 1 is as follows.

In order to obtain the Miller effect, a capacitor is connected between the input and the output, which are in the relationship in which the gain is negative, in the amplification stage. The folded cascode amplifier circuit in FIG. 1 is a differential type, and therefore, there exists a differential output with respect to a differential input. The amplification transistor in the amplification stage is a gate-grounded transistor and the gain is positive, however, the input of one of the amplification transistors and the output of the other amplification transistor are in opposite phases, and therefore, equivalent to having a negative gain in terms of signal.

Consequently, in the folded cascode amplifier circuit of the embodiment, the Miller effect is obtained in a pseudo manner by connecting a capacitor between signal lines having a relationship of negative gain between the differential input and the differential output.

Figure 9:
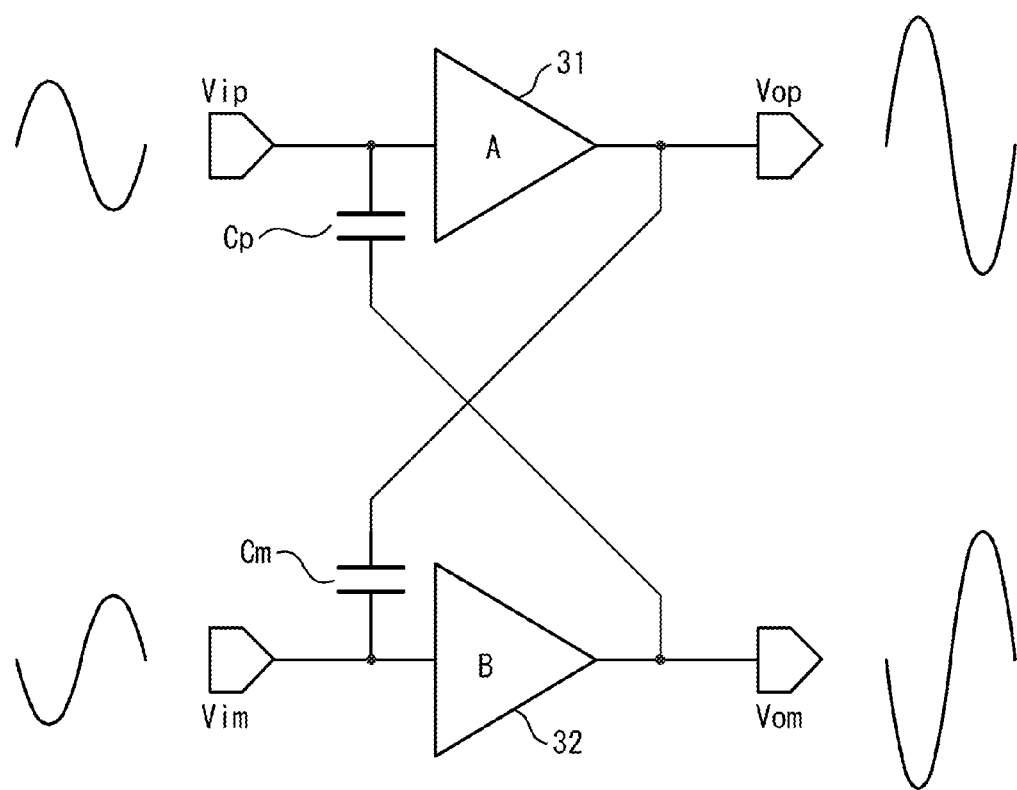
FIG. 9 is a diagram illustrating a configuration in which outputs of amplifiers having positive gains and signals the polarities of which are opposite, such as differential signals, are connected via capacitors.

FIG. 9 is a diagram illustrating a configuration in which outputs of amplifiers 31 and 32 having positive gains A and B and signals Vip and Vim the polarities of which are opposite, such as differential signals, are connected via capacitors. It is assumed that Vim=−C*Vip (C>0) holds. It is possible to regard Vom as Vom=−B*C*Vip when viewed from Vip and to regard Vop as Vop=−A*(1/C)*Vim when viewed from Vim. Because of this, by connecting capacitors Cp and Cm in a crossed manner as in FIG. 9, it is possible to derive the Miller effect in a pseudo manner.

Figure 10:
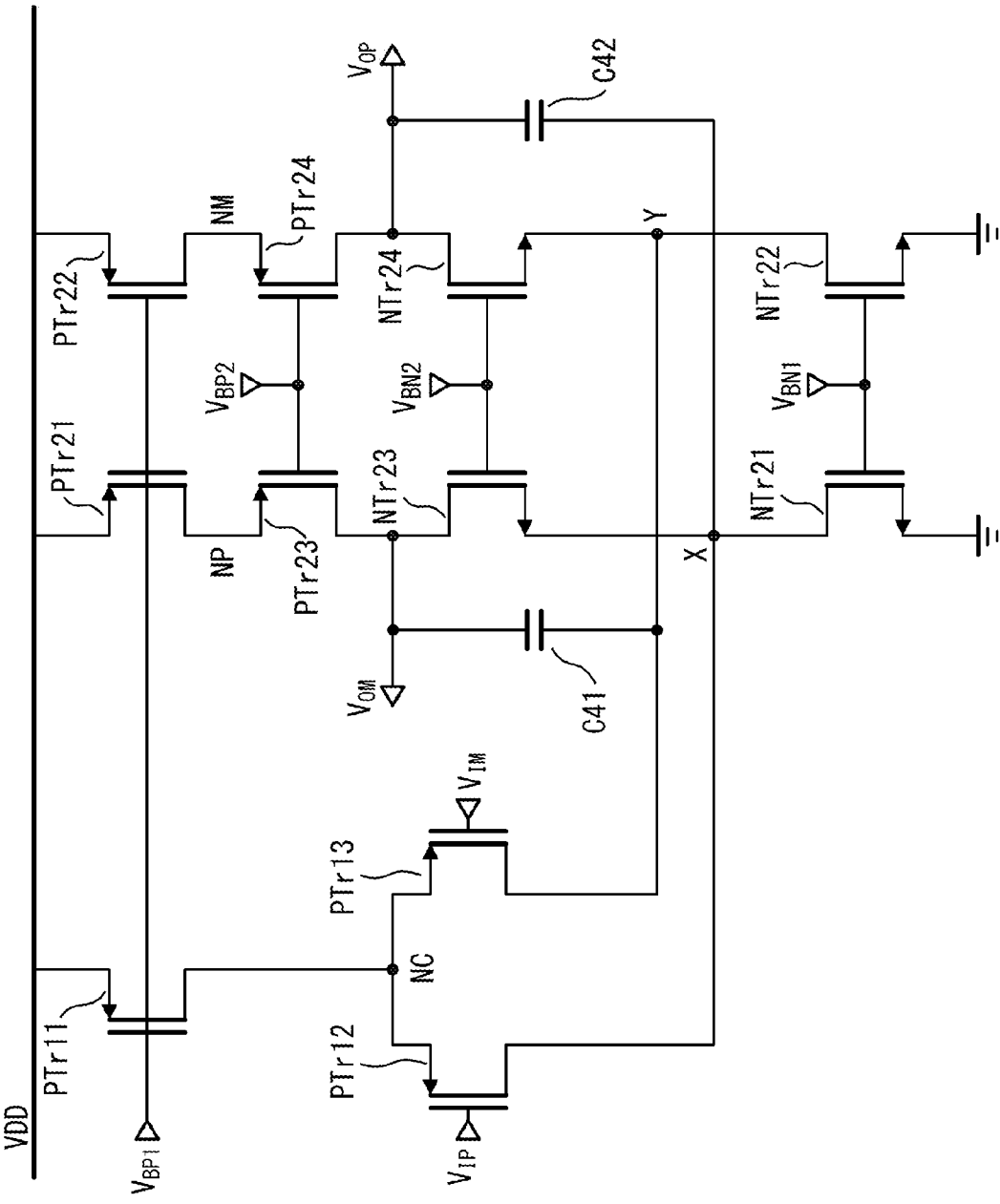
FIG. 10 is a circuit diagram of a folded cascode amplifier circuit of a first embodiment.

FIG. 10 is a circuit diagram of a folded cascode amplifier circuit of a first embodiment.

The folded cascode amplifier circuit of the first embodiment is a circuit in which a capacitor 41 is connected between a positive phase intermediate signal node and an opposite phase output signal node and a capacitor C42 is connected between an opposite phase intermediate signal node and a positive phase output signal node in the folded cascode amplifier circuit in FIG. 1. In other words, the capacitor C41 is connected between the node Y and the drain of the transistor NTr23 in the amplification stage that outputs an opposite phase output signal $V_{OM}$. The capacitor C42 is connected between the node X and the drain of the transistor NTr24 in the amplification stage that outputs a positive phase output signal $V_{OP}$.

By the pseudo Miller effect obtained by connecting NTr23 and NTr24 having the positive gain A between signal lines showing a negative gain in a pseudo manner, the capacitances of the capacitors C41 and C42 appear (1+A) times magnified from the output. Due to this, the frequency-phase characteristics of the circuit are shifted largely toward the side of lower frequencies as when a large capacitor is connected.

Figure 11:
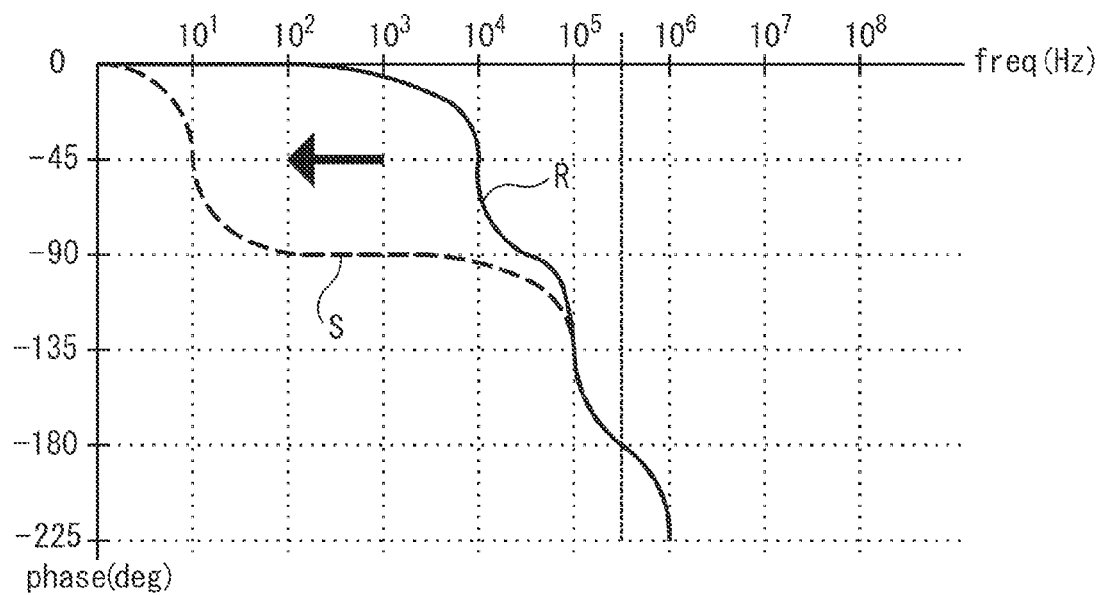
FIG. 11 is a diagram illustrating the frequency-phase characteristics of the folded cascode amplifier circuit of the first embodiment.

FIG. 11 is a diagram illustrating the frequency-phase characteristics of the folded cascode amplifier circuit of the first embodiment.

In FIG. 11, R represents the characteristics of the folded cascode amplifier circuit in FIG. 1 in which no capacitor is connected and S represents the frequency-phase characteristics of the folded cascode amplifier circuit of the first embodiment. As illustrated schematically, in the first embodiment, the frequency-phase characteristics shift largely toward the side of lower frequencies.

Figure 12:
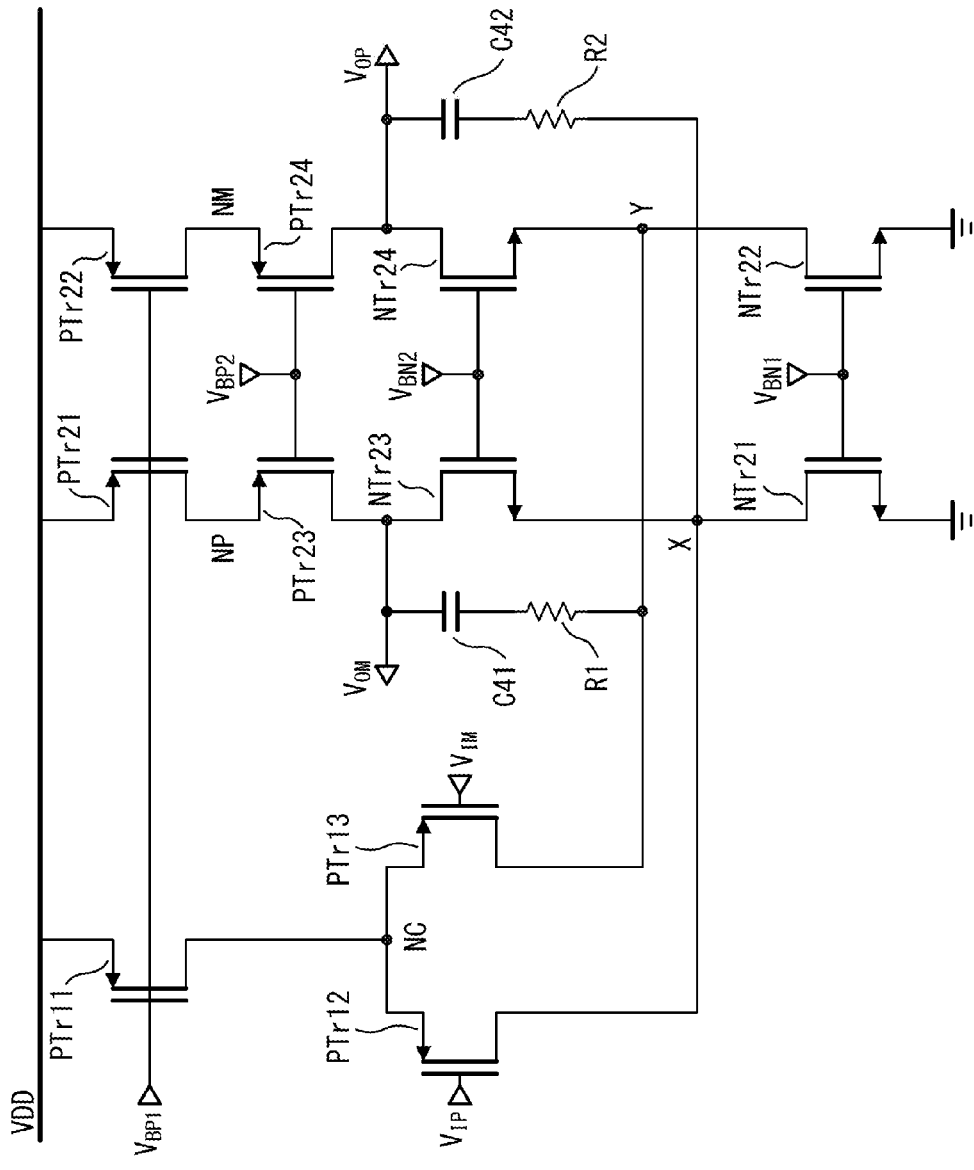
FIG. 12 is a circuit diagram of a folded cascode amplifier circuit of a second embodiment.

FIG. 12 is a circuit diagram of a folded cascode amplifier circuit of a second embodiment.

The folded cascode amplifier circuit of the second embodiment is a circuit in which a resistor R1 is connected between the node Y and the capacitor C41 and a resistor R2 is connected between the node X and the capacitor C42 in the folded cascode amplifier circuit of the first embodiment. In the second embodiment, it is possible to make the phase margin still larger than that in the first embodiment. It may also be possible to connect the resistor R1 between the node of the opposite phase output signal $V_{OM}$ and the capacitor C41 and the resistor R2 between the node of the positive phase output signal $V_{OP}$ and the capacitor C42.

Figure 13:
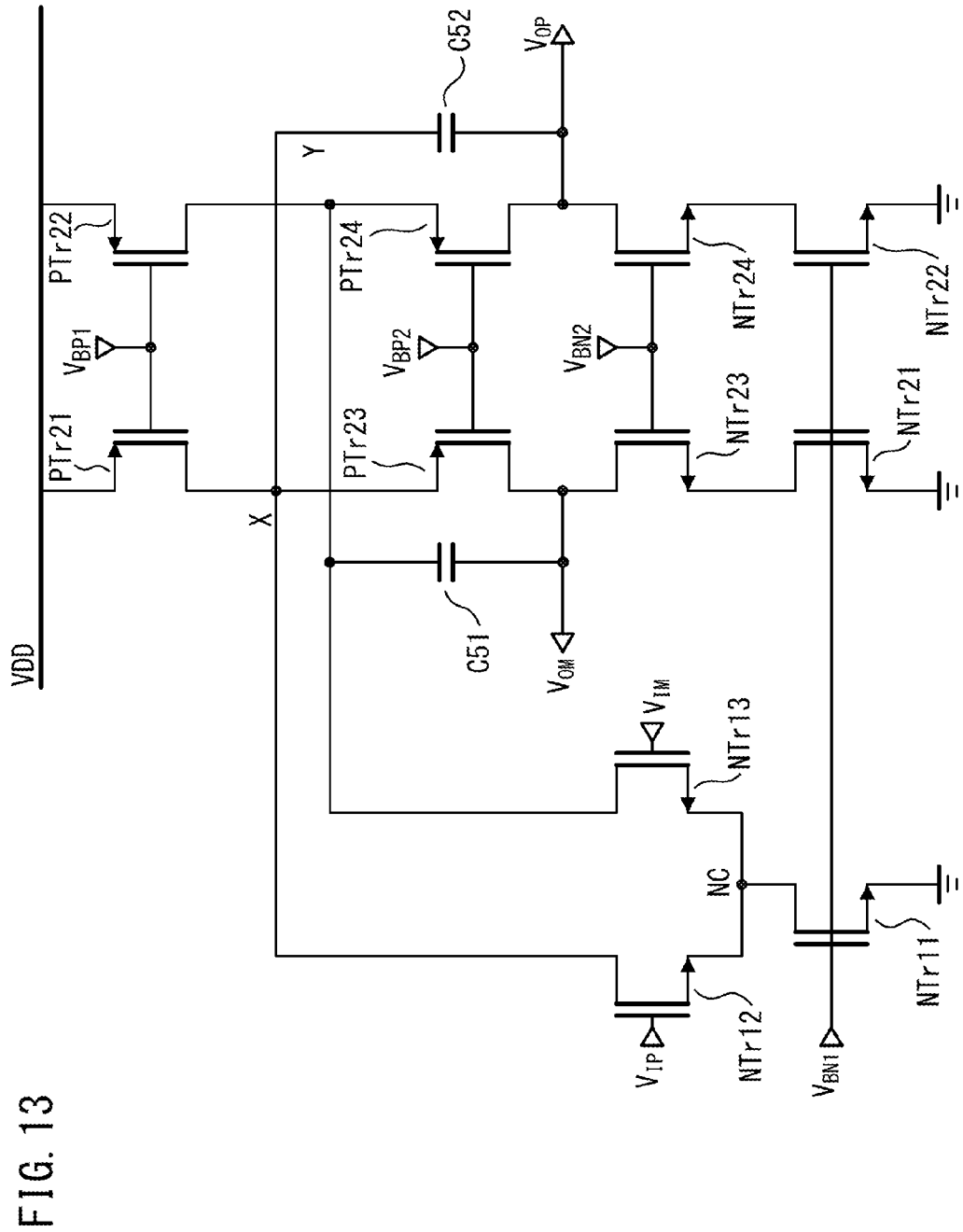
FIG. 13 is a circuit diagram of a folded cascode amplifier circuit of a third embodiment.

FIG. 13 is a circuit diagram of a folded cascode amplifier circuit of a third embodiment.

The folded cascode amplifier circuit of the third embodiment is a circuit in which the input stage of the folded cascode amplifier circuit of the first embodiment is made as a pair of NMOS transistors and the amplification stage is modified in accordance therewith. Explanation is omitted.

Figure 14:
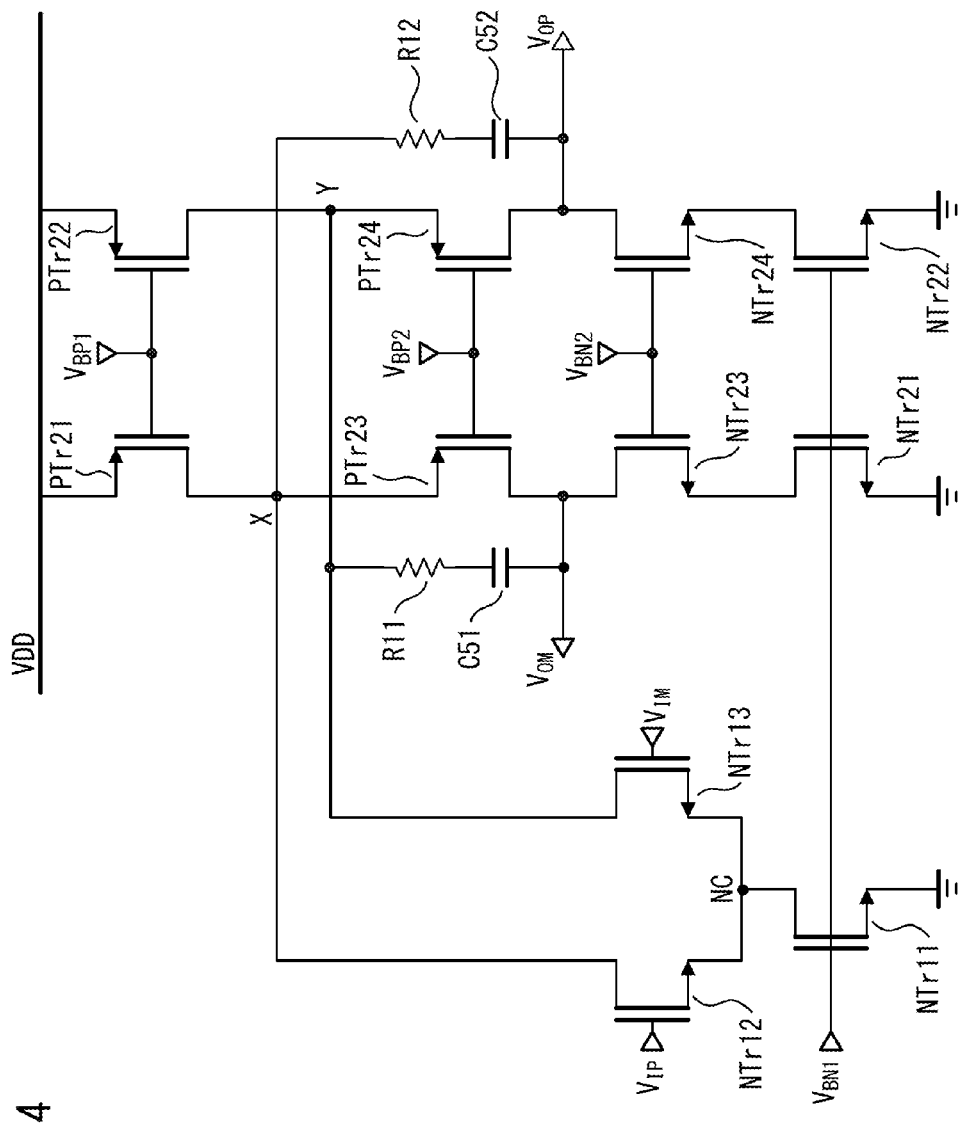
FIG. 14 is a circuit diagram of a folded cascode amplifier circuit of a fourth embodiment.

FIG. 14 is a circuit diagram of a folded cascode amplifier circuit of a fourth embodiment.

The folded cascode amplifier circuit of the fourth embodiment is a circuit in which the input stage of the folded cascode amplifier circuit of the second embodiment is made as a pair of NMOS transistors and the amplification stage is modified in accordance therewith. Explanation is omitted.

Figure 15A:
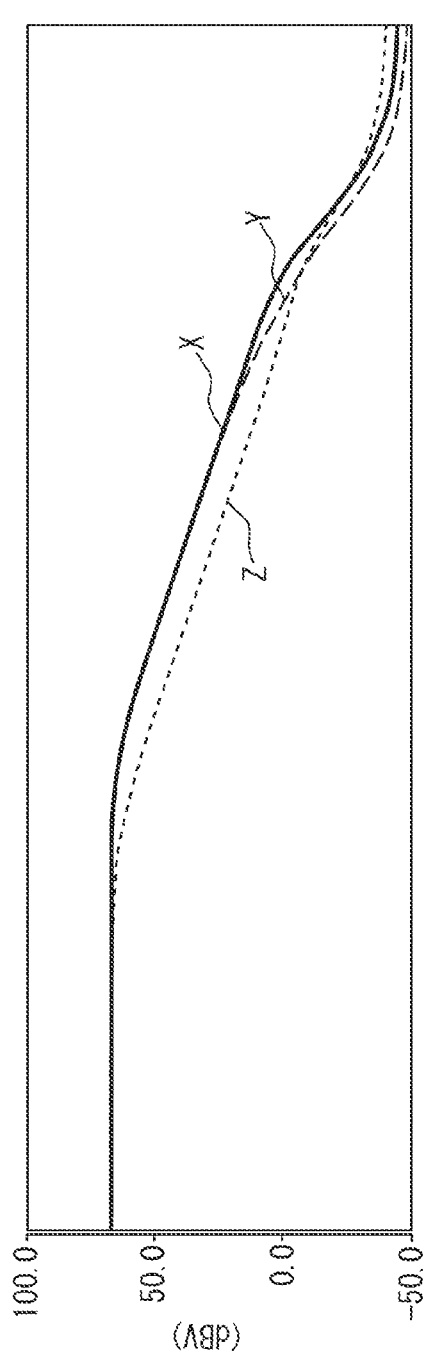
FIG. 15A and FIG. 15B are diagrams illustrating the frequency-gain characteristics and the frequency-phase characteristics of the folded cascode amplifier circuit of the first embodiment obtained from the result of AC analysis performed to check the effect.
Figure 15B:
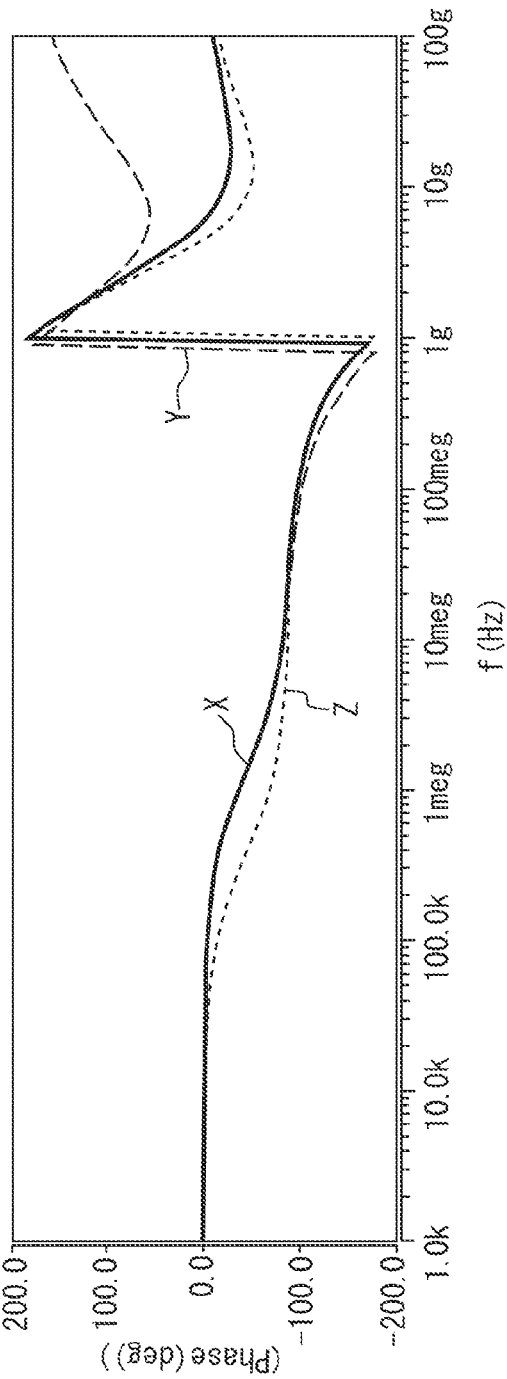

FIG. 15A and FIG. 15B are diagrams illustrating the frequency-gain characteristics and the frequency-phase characteristics of the folded cascode amplifier circuit of the first embodiment obtained from the result of AC analysis performed to check the effect.

In FIG. 15A and FIG. 15B, X represents the characteristics of the folded cascode amplifier circuit in which phase compensation is not performed as in FIG. 1. In this case, there is no phase margin. Y represents the characteristics in the case where a capacitor of 20 fF is added as C31 and C32 as in the folded cascode amplifier circuit in FIG. 8. The phase is not at all improved and it is known that there is no phase margin. Z represents the characteristics in the case where a capacitor of 20 fF is added as C51 and C52 in the folded cascode amplifier circuit of the first embodiment. The first pole moves considerably, the phase margin is improved, and a phase margin of 31° is obtained.

FIG. 16A and FIG. 16B are diagrams illustrating the frequency-gain characteristics and the frequency-phase characteristics of the folded cascode amplifier circuit of another embodiment obtained from the result of AC analysis performed to check the effect. FIG. 16A and FIG. 16B are illustrated in a partially duplicated manner with FIG. 15A and FIG. 15B.

In FIG. 16A and FIG. 16B, D represents the characteristics of the folded cascode amplifier circuit in which phase compensation is not performed as in FIG. 1. In this case, there is no phase margin. E represents the characteristics in the case where a capacitor of 4.5 pF is added as C1 and C2 as in the folded cascode amplifier circuit in FIG. 3. A large capacitor with a large capacitance is added, however, the phase is not improved so much and the phase margin is 7°. F represents the characteristics in the case where a capacitor of 20 fF is added as C51 and C52 in the folded cascode amplifier circuit of the first embodiment. The phase margin is 31°. G represents the characteristics in the case where a capacitor of 20 fF is added as C51 and C52 and a resistor of 5 kΩ is added as the resistors R1 and R2 in the folded cascode amplifier circuit of the second embodiment. The phase margin is further improved and 48°.

As above, the embodiments are explained, however, the pseudo Miller effect explained is an example and it is not limited to the folded cascode amplifier circuit.

According to the embodiments, only by adding a small capacitor, it is possible to considerably shift the frequency-phase characteristics toward the side of lower frequencies. Due to this, oscillation in a circuit is prevented, in which a folded cascode amplifier circuit is used with feedback being set. In other words, the same effect as that obtained when substantially a large capacitor is added is obtained and a folded cascode amplifier circuit that rarely oscillates is implemented.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A folded cascode amplifier circuit comprising:
   an input stage having a pair of transistors and configured to output a positive phase intermediate signal and an opposite phase intermediate signal, which are differential signals;
   a cascode amplification stage having pairs of transistors connected in multiple stages, to which the positive phase intermediate signal and the opposite phase intermediate signal are supplied, and which is configured to output a positive phase output signal and an opposite phase output signal, which are differential signals;
   a first capacitor connected between a signal line of the positive phase intermediate signal and a signal line of the opposite phase output signal; and
   a second capacitor connected between a signal line of the opposite phase intermediate signal and a signal line of the positive phase output signal.

2. The folded cascode amplifier circuit according to claim 1, further comprising:
   a first resistor element connected between the first capacitor and the signal line of the positive phase intermediate signal or between the first capacitor and the signal line of the opposite phase output signal; and
   a second resistor element connected between the second capacitor and the signal line of the opposite phase intermediate signal or between the second capacitor and the signal line of the positive phase output signal.

3. The folded cascode amplifier circuit according to claim 1, wherein
   the pair of transistors of the input stage has PMOS transistors.

4. The folded cascode amplifier circuit according to claim 2, wherein
   the pair of transistors of the input stage has PMOS transistors.

5. The folded cascode amplifier circuit according to claim 1, wherein
   the pair of transistors of the input stage has NMOS transistors.

6. The folded cascode amplifier circuit according to claim 2, wherein
   the pair of transistors of the input stage has NMOS transistors.

* * * * *